United States Patent [19]
Matthai

[11] 4,321,664
[45] Mar. 23, 1982

[54] RECTIFIER ASSEMBLY WITH HEAT SINK

[75] Inventor: Günter Matthai, Nehren, Fed. Rep. of Germany

[73] Assignee: Robert Bosch GmbH, Stuttgart, Fed. Rep. of Germany

[21] Appl. No.: 111,822

[22] Filed: Jan. 14, 1980

[30] Foreign Application Priority Data

Feb. 7, 1979 [DE] Fed. Rep. of Germany ....... 2904523

[51] Int. Cl.³ ............................................. H02M 7/06
[52] U.S. Cl. ................................... 363/141; 363/145; 310/68 D
[58] Field of Search ............. 363/141, 145; 310/68 D; 357/77, 81

[56] References Cited

U.S. PATENT DOCUMENTS

| | | | |
|---|---|---|---|
| 3,187,812 | 6/1965 | Staver | 357/81 |
| 3,198,972 | 8/1965 | Larson | 357/81 |
| 3,553,505 | 1/1971 | Sato | 310/68 D |
| 3,970,881 | 7/1976 | Sato | 310/68 D |

*Primary Examiner*—William H. Beha, Jr.
*Attorney, Agent, or Firm*—Frishauf, Holtz, Goodman & Woodward

[57] ABSTRACT

Two U-shaped sheet metal members having legs through which the cooling air passes have bases onto which at least two of the load current carrying diodes are fastened, the connection between the diodes and the sheet metal members forming the heat sink being a highly heat conductive connection.

24 Claims, 21 Drawing Figures

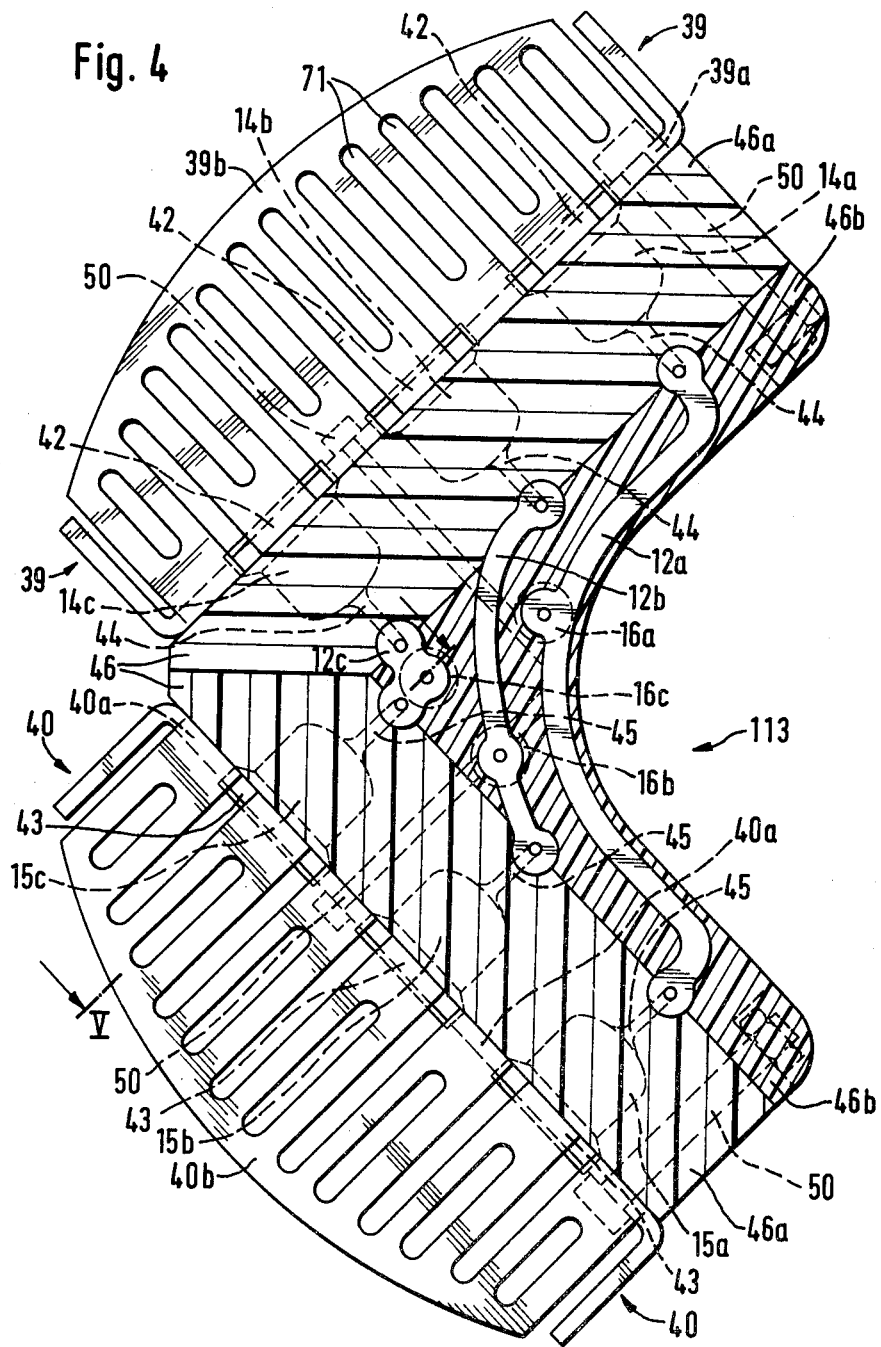

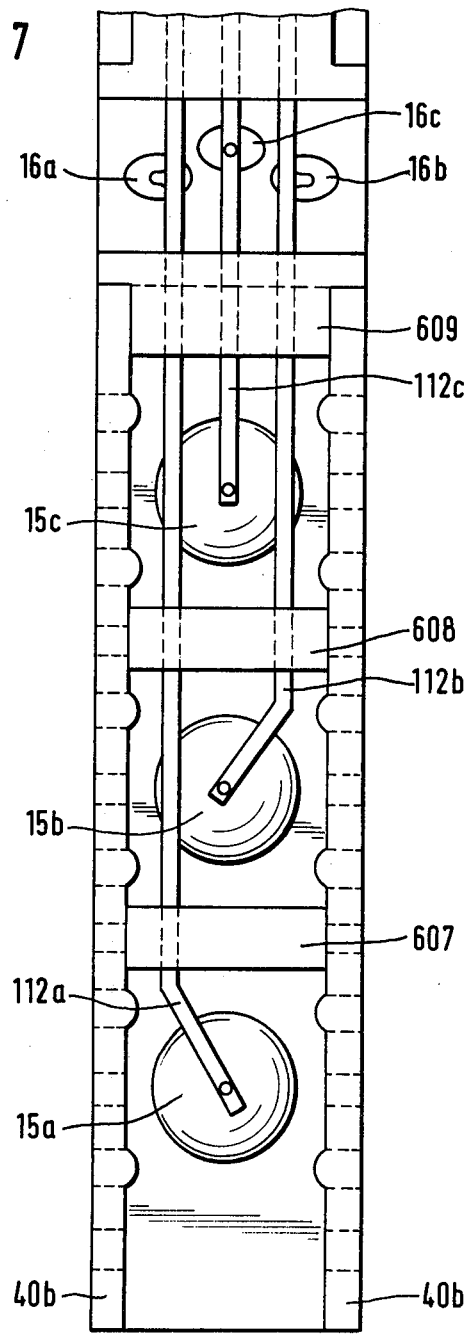

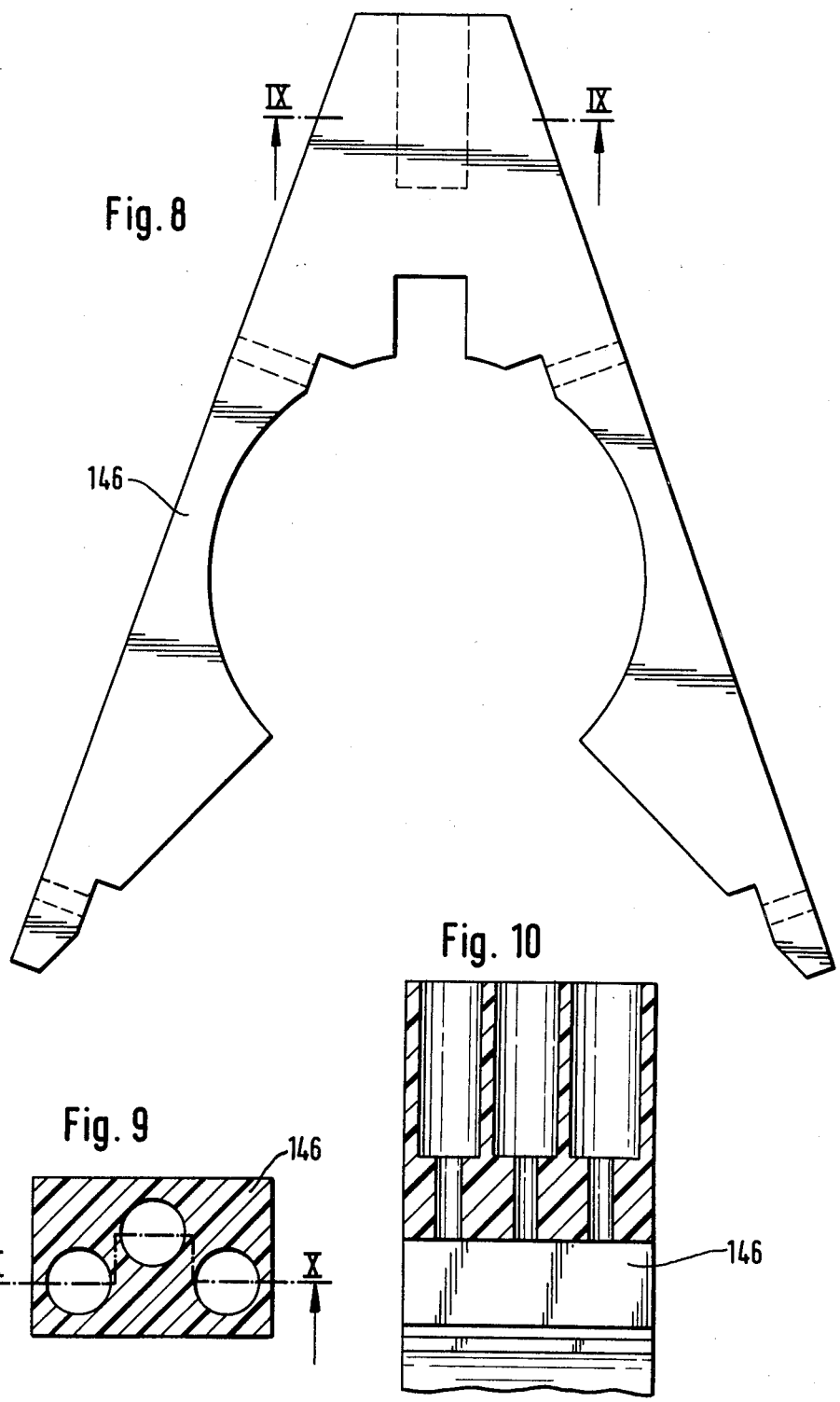

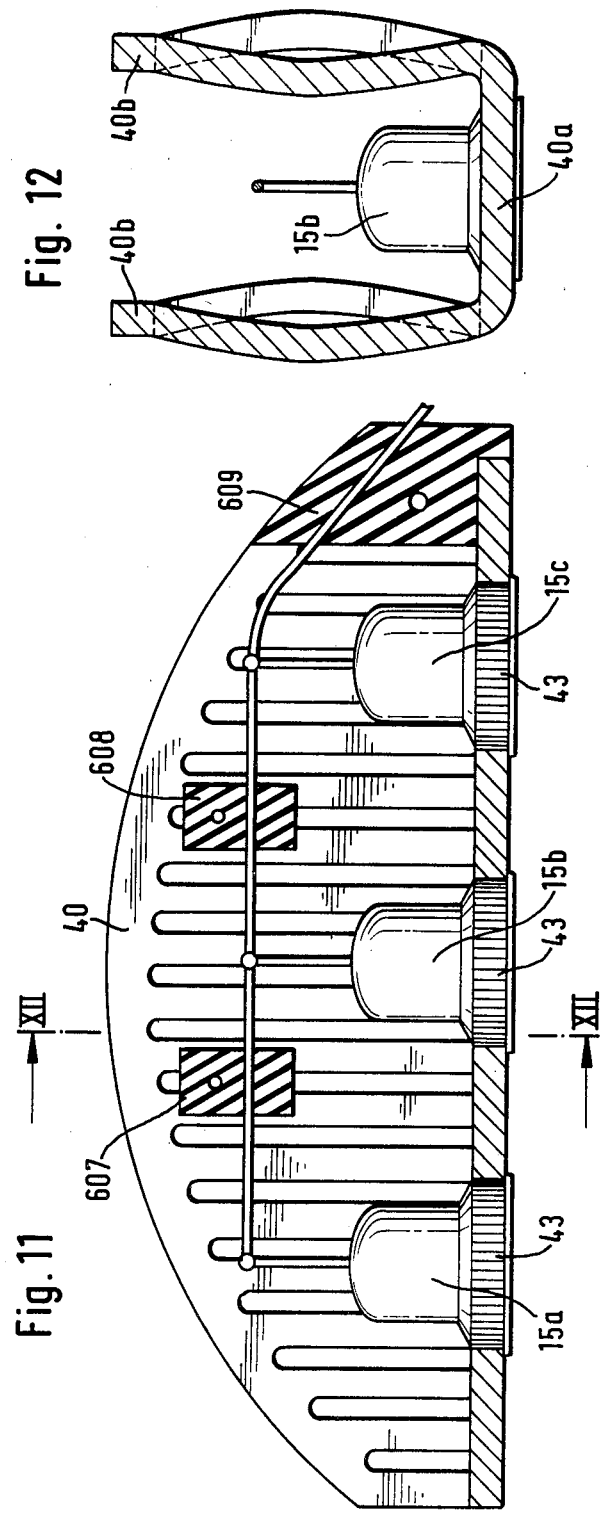

RECTIFIER ASSEMBLY WITH HEAT SINK

The present invention relates to rectifier assemblies for alternators, and, in particular, to alternators used in motor vehicles.

BACKGROUND AND PRIOR ART

In a rectifier assembly disclosed in British Pat. No. 976,458, the diodes carrying the load current are arranged in pairs between two rails which are braced against each other and which also constitute electrical conductors. The electrical connection between the diodes and the rails is achieved by contact pressure. This arrangement has the disadvantage that two main diodes must be arranged one after the other in the axial direction of the alternator, so that a great deal of space is required. The cooling of these diodes is also difficult.

THE INVENTION

It is an object of the present invention to decrease the space required for the rectifier assembly in the axial direction of the generator. It is a further object of the present invention to furnish a heat sink whereby the cooling of the diodes is improved in spite of the lesser space occupied. This improved cooling improves the reliability of the assembly by decreasing the temperature at the depletion layer of the diodes for the same load current. Alternatively, if the temperature at the depletion layer is maintained the same as in conventional arrangements, the load current may be increased thereby increasing the possible range of application of the diode assembly.

It is a further object of the present invention to furnish a diode assembly which is relatively immune to vibration.

In accordance with the present invention, the heat sink comprises two U-shaped sheet metal members, each having two legs and a base, each of the legs having a plurality of slots, two of the load-carrying diodes being fastened to each of the bases in such a way that heat is freely conducted between the diode and the U-shaped member.

DRAWINGS ILLUSTRATING PREFERRED EMBODIMENTS:

FIG. 4 is a first embodiment of a rectifier assembly according to the present invention;

FIG. 7 is a top view, partially broken, of the assembly shown in FIG. 6;

FIG. 8 is a top view of the plastic body of FIG. 6;

FIG. 9 is a sectional view along line IX—IX of FIG. 8;

FIG. 10 is a sectional view along line X—X of FIG. 9;

FIG. 11 is a side view of the U-shaped metal member shown in FIG. 6 with inserted load-carrying diode;

FIG. 12 is a section along line XII—XII of FIG. 11;

Figure 1:
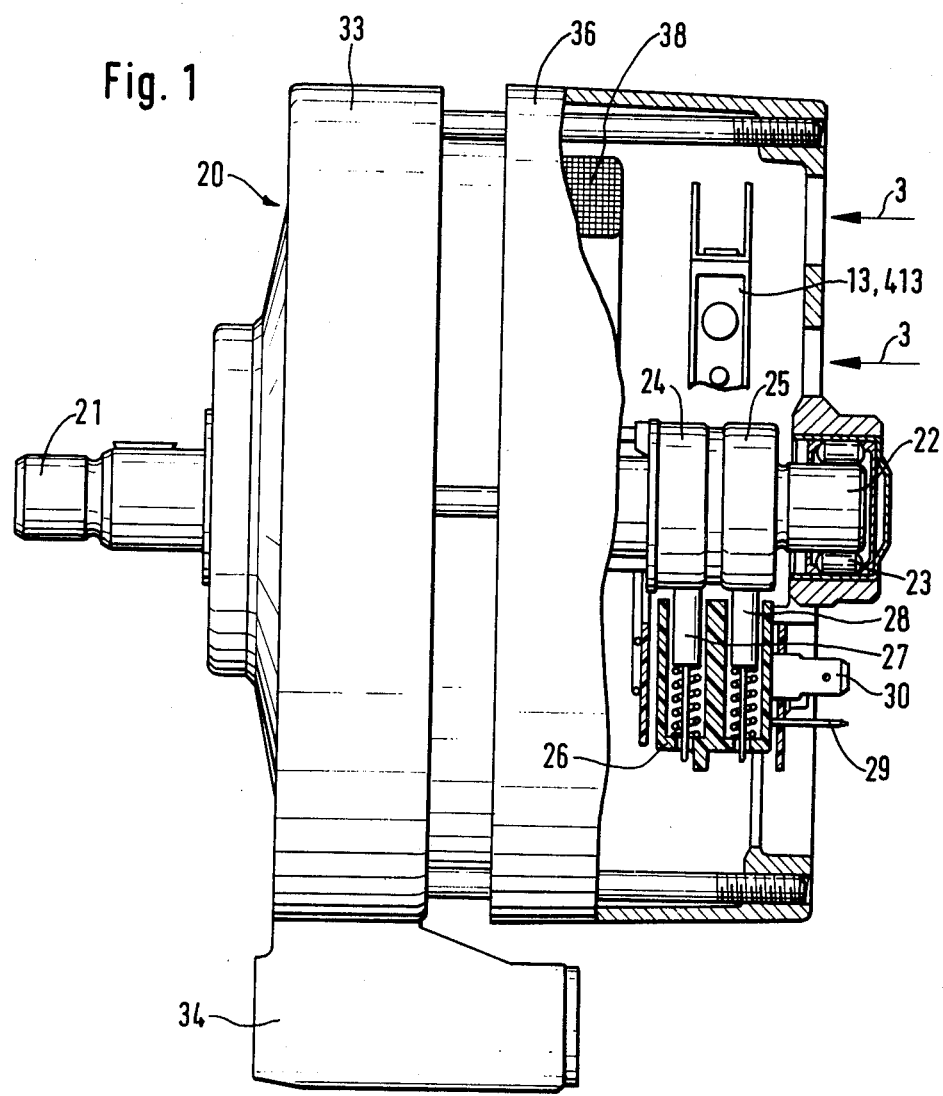
FIG. 1 is a side view, partially in section, of an alternator with a rectifier assembly according to the present invention.

Alternator 20 of FIG. 1 is shown as an AC-claw pole generator. Its drive shaft 21 may, for example, be driven by the internal combustion engine of the motor vehicle. The end 22 of the shaft opposite the driven end is surrounded by a needle bearing 23 and carries two slip rings 24, 25 for energizing a field winding which rotates with shaft 21. A brush holder 26 carries brushes 27, 28 which supply current to slip rings 24 and 25 and which are connected to outlets 29 and 30 on the external side of generator 20. The outlets have the same reference numeral in FIG. 2 in which the electrical circuit diagram of generator 20 is pictured.

End plate 33 on the driving side has a mounting arm 34. The diode assembly according to a fourth embodiment of the present invention (413) could be mounted within bearing bracket 36 opposite bearing plate 33, that is the six load-carrying diodes which rectify the three-phase voltage delivered by the stator windings 38 of generator 20 and the three field exciter diodes would be contained therein. The rectifier assembly (13 or 413) is only schematically indicated in FIG. 1. The cool air current generated by a fan mounted on the left side of the generator is denoted by reference numeral 3.

Figure 2:
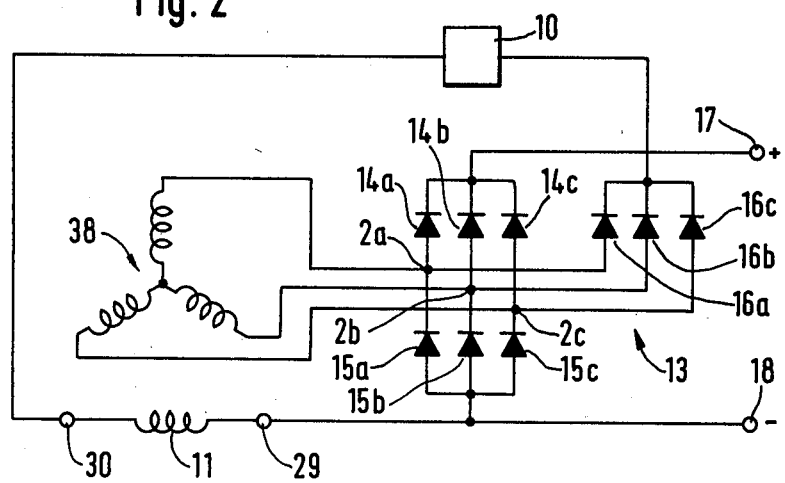
FIG. 2 is a circuit diagram showing the rectifier assembly connected to the windings of the alternator.

The electric circuit diagram of rectifier assembly 13 and the windings of the alternator is shown in FIG. 2. The three stator windings 38 are connected to three AC terminals 2a, 2b and 2c of rectifier assembly 13. The latter has six load diodes, including three plus diodes 14a, 14b, 14c, whose cathodes are connected to the plus terminal 17 and three minus diodes 15a, 15b and 15c, whose anodes are connected to the minus output terminal 18. The cathodes of diodes 15a, 15b and 15c and the anodes of diodes 14a, 14b and 14c are connected to terminals 2a, 2b, and 2c. Three field exciter diodes, 16a, 16b and 16c are also shown. The cathodes of the field exciter diodes are connected in common, while the anodes are connected to terminals 2a, 2b and 2c, respectively. The cathodes of the field exciter diodes are connected through a voltage regulator 10 and the field winding 11 to the minus terminal 18. The terminals of field winding 11 are denoted by reference numerals 29 and 30.

Figure 3A:
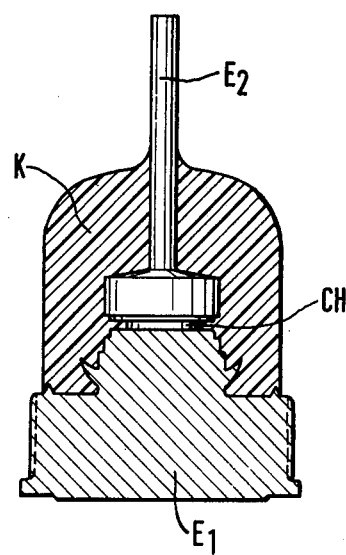
FIGS. 3a and 3b illustrate a first and second embodiment of a load-carrying diode in accordance with the present invention.

FIG. 3a illustrates one possible construction for one of the load-carrying diodes 14 or 15. It will be noted that the construction is axially symmetrical. A first electrode E1 is illustrated as a massive metallic base having a raised axially symmetrical central portion and ridges along the outer surface. Electrode E1 may be either the anode or the cathode of the diode. Correspondingly, the other electrode $E_2$ will be the cathode or the anode. Electrode $E_2$ is a wire. A semiconductor chip CH is soldered between electrodes $E_1$ and $E_2$. The assembly is covered with a plastic sheath K. This construction for the load-carrying diodes is used in all embodiments of the rectifier assembly except that shown in FIG. 15.

Figure 3B:
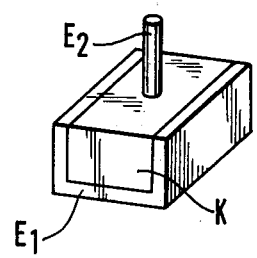
Figure 15:
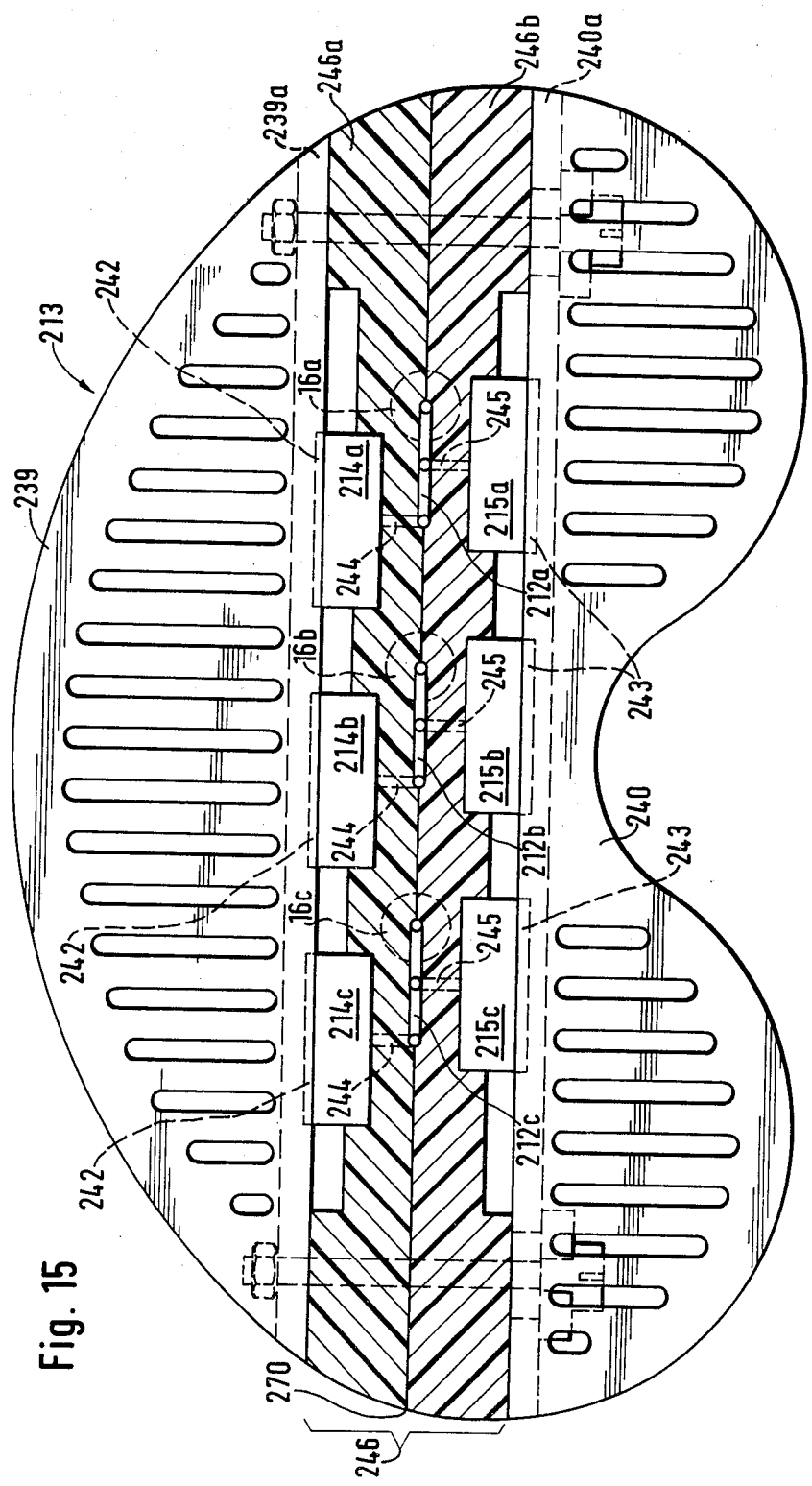
FIG. 15 is a sectional view along the plane of symmetry of the two U-shaped metal members for a third embodiment of the present invention.

In the assembly shown in FIG. 15, the load-carrying diodes are constructed as shown in FIG. 3b. Corresponding parts of the diodes have the same reference designations as in FIG. 3a. The electrode $E_1$, which is again a relatively massive metal base, in this case has a U-shape. The plastic K fills in the space between the two legs of the U-shaped electrode $E_1$.

Figure 3C:
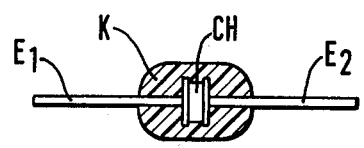
FIG. 3c is a diagram illustrating a field exciter diode.

The construction of the field exciter diodes is shown in FIG. 3c. Here, too, corresponding parts are labelled with the same reference numeral. The construction is also axially symmetrical and is also symmetrical to chip CH. This construction is used for all embodiments of the present invention which are illustrated herein.

FIG. 4 shows a first embodiment 113 of a rectifier assembly 14 according to the present invention. Two U-shaped sheet metal parts 39 and 40 are provided which receive the load current carrying diodes 14a, 14b, 14c, 15a, 15b, and 15c and which also act as heat sinks for these diodes. The sheet metal parts are so formed that three of the diodes having the same polarity can be fastened in a row along each base. The bases 39a and 40a therefore have a relatively large dimension in this direction. In a direction perpendicular to this direction, bases 39a and 40a of sheet metal parts 39 and 40 are so thin, that there is just enough room for one diode. Metal parts 39 and 40 are bent into a U-shape along their total length, the legs 39b and 40b of these U-shaped units having slots 71 extending in a direction perpendicular to the base. The width of the slots is approximately half of the thickness of the metal sheet, which is 1 to 3 mm; the width of the metal between the slots being approximately equal to the thickness of the metal. Slots 71 allow cooling air to pass therethrough. The metal between the slots is joined along the edges of the U-shaped members so that the stability of these members is maintained.

Base 39a of the first U-shaped sheet metal member 39 has three bores into which the cathodes 42 of diodes 14a, 14b and 14c are pressed. These cathodes are the cathodes shown in FIG. 3a, that is they are axially symmetrical cylindrical bases $E_1$ and have a straight knurling around their surface which causes them to be anchored in base 39a of metal part 39. Similarly, base 40a of member 40 has three bores into which the anodes 43 of diodes 15a, 15b and 15c are pressed. The anodes are constructed similarly as the cathodes 42 of diodes 14a etc. and have the same type of knurling in order to assure a solid connection with the base 40a.

It should further be noted that the bodies of diodes 14 and 15 extend away from the bases 39a and 40 in a direction opposite the direction of legs 39b and 40b, respectively. The diodes are constructed as so-called "insert" diodes, the main body of the diode being enclosed in a plastic case from which a connecting wire $E_2$ projects in a direction opposite to electrode $E_1$ (FIG. 3a). This wire constitutes anode 44 for diodes 14a, 14b and 14c and cathode 45 for diodes 15a, 15b and 15c.

A two-part V-shaped plastic body 46 is provided for receiving the parts of the diodes 14 and 15 projecting from U-shaped members 39 and 40, as well as the exciter diodes 16a, 16b and 16c. Specifically, V-shaped plastic body 46 consists of a first part 46a receiving diodes 14 and 15 and a second V-shaped part 46b receiving the field exciter diodes.

Part 46a may be thought of as consisting of two elongated beam shaped members meeting at right angles. Part 46a abuts the bases of metal members 39 and 40 in such a way that diodes 14a, 14b and 14c project into corresponding recesses in one of the beams, while the bodies of diodes 15a, 15b and 15c project into corresponding recesses in the other beam.

The width and length of both beams correspond approximately to the width and length of bases 39a and 40a (e.g. 25 mm and 65 mm respectively), while the thickness of the beam is such that the bodies of diodes 14 and 15 are completely surrounded. However, electrodes $E_2$ of the six-load carrying diodes, which constitute the leads, are not completely surrounded by part 46a. They extend to the top surfaces of part 46a which are respectively opposite bases 39a and 40a. They are bent by an angle of 90° within both beams constituting part 46a, so that the ends extend to the lateral surface 47 of V-shaped body 46 which is perpendicular to bases 39a and 40a, respectively. (FIG. 4) This is illustrated more clearly in the sectional view of FIG. 5.

Figure 5:
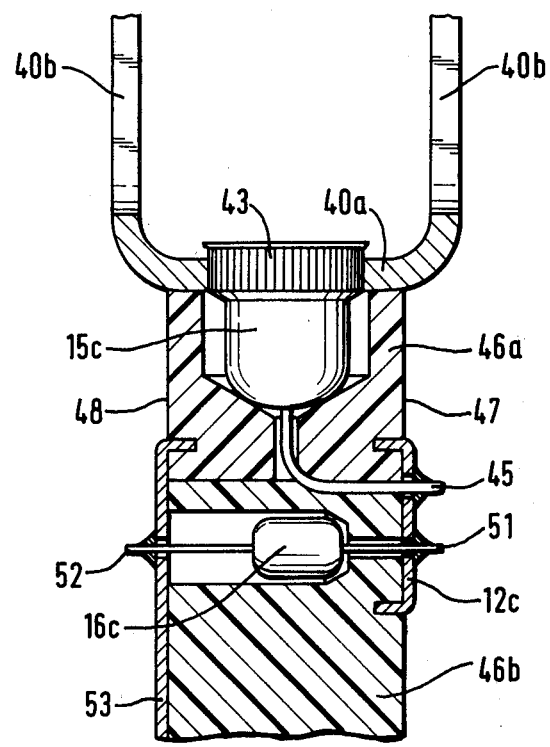
FIG. 5 is a sectional view along line V—V of FIG. 4.

Anodes 44 of diodes 14a, 14b and 14c and cathodes 45 of diodes 15a, 15b and 15c are clamped in place by the second part 46b which fits into the V-shaped space left by part 46a and is pressed onto part 46a in such a manner that electrodes 44 and 45 are clamped between parts 46a and 46b (FIG. 4, FIG. 5). The U-shaped metal parts 39 and 40 and the two parts 46a and 46b are screwed together by means of screws 50.

The anodes 44 of diodes 14a, 14b and 14c and the cathodes 45 of diodes 15a, 15b and 15c are electrically connected in pairs at lateral surface 47. For this purpose, metal strips 12a, 12b and 12c are applied to lateral surface 47 and crimped thereon. Anodes 44 of diodes 14a, 14b and 14c and cathodes 45 of diodes 15a, 15b and 15c pass through bores in strips 12a, 12b and 12c and are soldered to the strips in the vicinity of the bores.

Rectifier assembly 113 also includes three field exciter diodes 16a, 16b and 16c. These are received in recesses in part 46b which extend from lateral surface 47 to a second lateral surface 48 of the V-shaped plastic body 46.

Anodes 51 of exciter diodes 16a, 16b and 16c are, respectively, electrically connected to metal strips 12a, 12b and 12c. Metal strips 12a, 12b and 12c extend along lateral surface 47 over the respective recesses in plastic body 46. Anodes 51 of diodes 16a, 16b and 16c each pass through a bore in one of the strips 12a, 12b and 12c and each is soldered to the strip in the vicinity of the bore.

Cathodes 52 of exciter diodes 16a, 16b and 16c project from the second lateral surface 48 of plastic body 46 and are there electrically connected to each other by a metal strip 53 which is crimped onto lateral surface 48. Each of the cathodes 52 passes through a bore in metal strip 53 and is soldered to the metal strip in the region of the bore.

All soldered joints in FIGS. 4 and 5 can be manufactured by the flow solder method, since all the joints are located on the two surfaces 47 and 48 which are opposite one another. This compact construction further results in a high resistance to vibration and to the strong jolts which often occur in motor vehicles.

Figure 6:
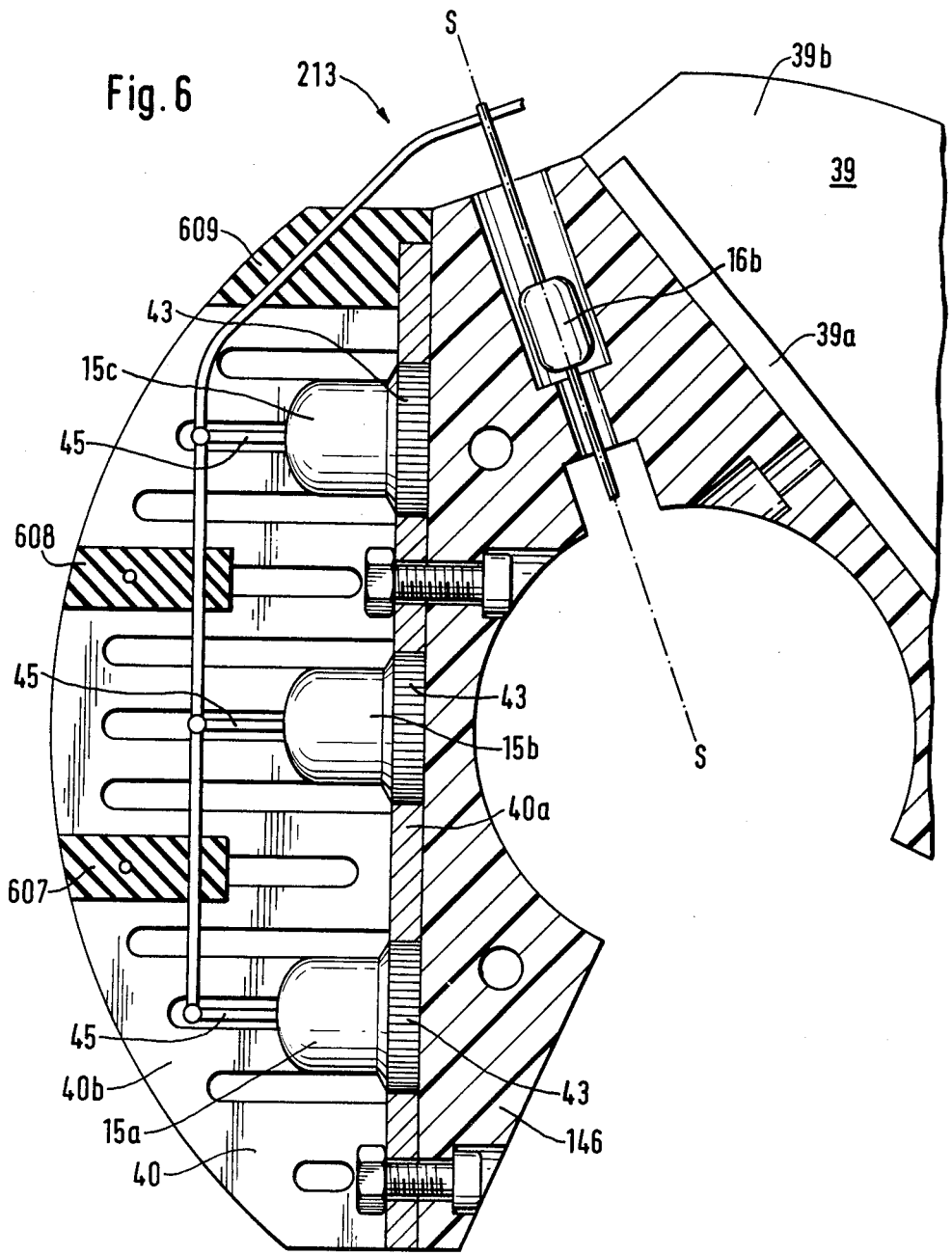
FIG. 6 shows a second embodiment of the rectifier assembly according to the present invention, in a sectional view along the plane of symmetry of the two U-shaped sheet metal members.

FIG. 6 show a second embodiment 213 of the rectifier assembly 13. Here the three load-carrying diodes are pressed into each of the bases 39a and 40a of the U-shaped metal members 39 and 40 in such a way that they extend from bases 39a and 40a in the same direction as do legs 39b and 40b, respectively. FIG. 6 shows only that part of the assembly which contains diodes 15a, 15b and 15c. It will be evident from FIG. 6, that the two U-shaped members 39 and 40 are held together by a V-shaped plastic body 146 to which the bases 39a and 40a are fastened. The shape of plastic body 146 is mirror symmetrical to line S—S but, in contrast to the plastic body shown in FIG. 4, is manufactured as a single unit and generally receives only exciter diodes 16a, 16b and 16c, since diodes 14 and 15 extend in the direction of legs 39b and 40b and therefore do not require much room within plastic body 146.

FIG. 7 illustrates how the electrical connections between the corresponding electrodes of diodes 14 and 15 and field exciter diodes 16a, 16b and 16c are manufactured. Leads 12a, 12b and 12c are welded onto the diodes and, to increase the resistance to vibration, are held by insulating guide members 607, 608 and 609. Specifically, anodes 44 of diodes 14a, 14b and 14c are connected in pairs with corresponding ones of cathodes 45 of diodes 15a, 15b and 15c. The anodes of diodes 16a, 16b and 16c are each connected to a respective one of leads 112a, 112b and 112c, while their cathodes are connected to each other. To increase the resistance to vibration, the diodes are received by recesses in plastic body 146, the recesses being arranged approximately in the plane of symmetry S—S.

FIG. 8 is a top view of plastic body 146, FIG. 9, a sectional view along lines IX—IX of FIG. 8, while FIG. 10 is a sectional view along line X—X of FIG. 9. These figures clearly illustrate the recesses which are provided for exciter diodes 16a, 16b and 16c.

FIG. 11 is a side view of U-shaped metal member 40 of FIG. 6, FIG. 12 being a sectional view along line XII—XII of FIG. 11.

FIG. 12 clearly illustrates that the metal portions between the slots in the U-shaped metal members may be bent relative to each other.

In the embodiments shown in FIG. 6-12, leads 112a, 112b and 112c may be automatically welded to the electrodes of the respective diodes.

Figure 13:
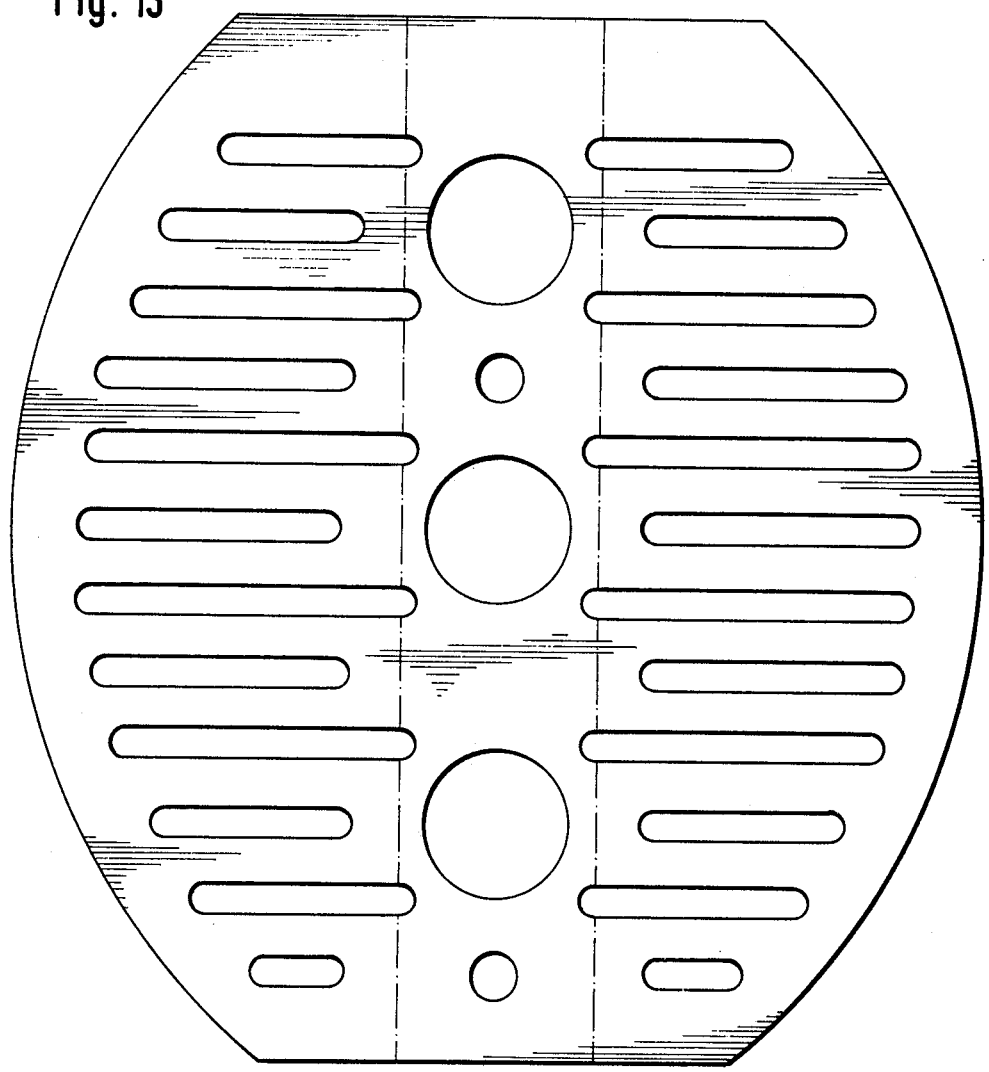
FIG. 13 shows the U-shaped metal member for the embodiments shown in FIGS. 4-12 as a sheet prior to bending.

FIG. 13 shows the U-shaped metal member for the embodiments shown in FIGS. 4-12 as a sheet prior to bending.

Figure 14:
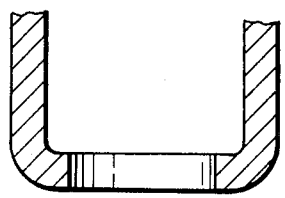
FIG. 14 is a partially sectional view of the metal member of FIG. 13 after bending.

FIG. 14 is a partially sectional view of the metal member of FIG. 13 after bending.

FIG. 15 shows a third embodiment 313 of the rectifier assembly of the present invention. The two U-shaped metal members 239 and 240 have bases 239a and 240a which have rectangular recesses since diodes 214a, 214b, 214c, 215a, 215b and 215c (the load current carrying diodes) here have a rectangular cross section (see FIG. 3b). Cathodes 242 of diodes 214 and anodes 243 of diodes 215 are inserted in these recesses. Plastic body 246 consists of two abutting board-shaped members 246a, 246b. The bases 239a and 240a of the heat sink and the two members 246a and 246b of the plastic body are joined to make a compact vibration resistant assembly by means of strong insulated screw connections. The anodes 244 of diodes 214a, 214b, 214c and the cathodes 245 of diodes 215a, 215b, 215c, each of which is formed as a straight lead wire, terminate at the boundary surface 270 of the two members 246a and 246b. Field exciter diodes 16a, 16b and 16c and the electrodes associated therewith are formed as axially symmetrical bodies, the axes being arranged in the boundary surface 270. The recesses for receiving exciter diodes 16a, 16b and 16c are therefore located one-half in member 246a and one-half in member 246b. Leads 212a, 212b and 212c, which connect anodes 244 of diodes 214 and cathodes 245 of diodes 215 in pairs and each pair with one of the anodes of diodes 16, are also located in boundary surface 270.

The embodiment shown in FIG. 15 may be modified in that diodes 214a, 214b, 214c, 215a, 215b and 215c need not be pressed into recesses, but may instead be soldered onto the bases of the U-shaped metal members.

Figure 16:
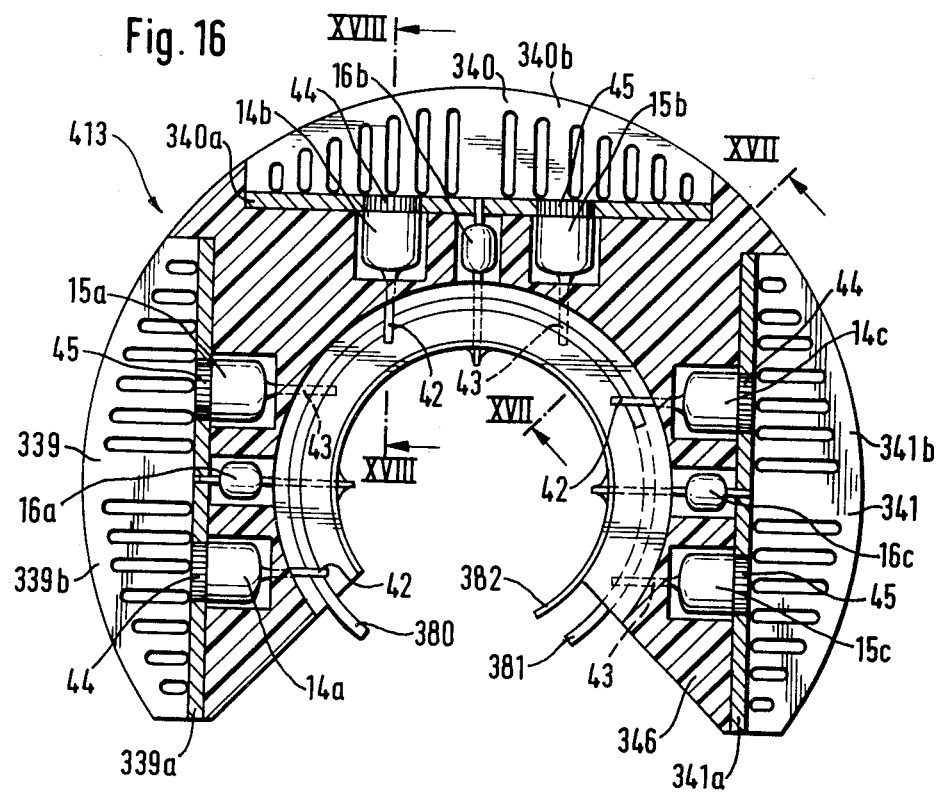
FIG. 16 illustrates a fourth embodiment of the present invention.
Figure 17:
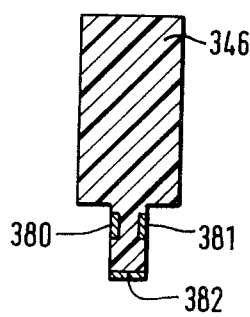
FIG. 17 is a sectional view along line XVII—XVII of FIG. 16.
Figure 18:
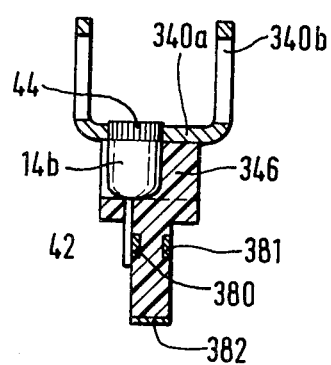
FIG. 18 is a sectional view along line XVIII—XVIII of FIG. 16.

A fourth embodiment of the rectifier assembly of the present invention is shown in FIGS. 16, 17 and 18. Here three U-shaped metal members 339, 340 and 341 are provided. Each of the bases 339a, 340a and 341a of the three metal members receives one of diodes 14 and the one of diodes 15 connected in series therewith. Specifically, base 339a of member 339 holds diode 14a and diode 15a, base 340a of metal member 340 holds diode 14b and diode 15b, while diode 14c and diode 15c are mounted on base 341a of metal member 341. The three metal members 339, 340 and 341 constitute the electrically conductive connection between the anodes 44 of diodes 14a, 14b, 14c and cathodes 45 of diodes 15a, 15b and 15c. These electrodes are formed as illustrated in FIG. 3a. Anodes 44 and cathodes 45 are pressed into corresponding bores in the bases of the metal members. Diodes 14a, 14b, 14c, 15a, 15b, and 15c, are fastened to metal members 339, 340 and 341 extend from the respective bases 339a, 340a and 341a in a direction opposite to the direction of the respective legs 339b, 340b and 341b into recesses in a plastic body 346. Plastic body 346 is fastened onto bases 339a, 340a and 341a of the U-shaped metal members and is, itself, substantially U-shaped. The plane of symmetry of the U-shaped plastic body 346 extends in a direction perpendicular to the joint plane of symmetry of the U-shaped metal members 339, 340 and 341. The cathodes 42 of diodes 14a, 14b and 14c are connected to each other by a first connecting wire 380. The anodes 43 of diodes 15a, 15b and 15c are connected to each other by a second connecting wire 381. The two connecting wires 380 and 381 extend along the upper surface of plastic body 346 and are embedded therein.

Three field exciter diodes 16a, 16b and 16c are provided, which are located in recesses of plastic body 346. Field exciter diode 16a is located between diode 14a and diode 15a, field exciter diode 16b between diode 14b and diode 15b, and field exciter diode 16c between diode 14c and diode 15c. The anodes of field exciter diode 16a, 16b and 16c are electrically connected to the respective bases 339a, 340a and 341a of the respective metal members 339, 340 and 341, while the cathodes of diodes 16a, 16b and 16c are electrically connected to each other by a third connecting wire 382. The third connecting wire 382 is mounted on the inner edge of U-shaped plastic body 346.

Figure 19:
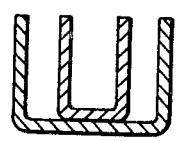
FIG. 19 shows a double-U embodiment of a heat sink.

For the embodiments shown in FIGS. 4, 15 and 16, the cooling surface may be enlarged by the addition of a smaller U-shaped metal member within the previously mentioned U-shaped metal member. The cooling air will then pass four rows of slotted walls (FIG. 19).

Various changes and modifications may be made within the scope of the inventive concepts.

I claim:

1. In a rectifier assembly for furnishing DC current at a positive and negative terminal in response to AC energization, said rectifier assembly comprising a plurality of first diodes (14a, 14b, 14c) each having a cathode connected to said positive terminal and an anode, a plurality of second diodes (15a, 15b, 15c) each having an anode connected to said negative terminal and a cathode, and means connecting said anodes of said first diodes and said cathodes of said second diodes in pairs: a heat sink comprising at least a first and second U-shaped sheet metal member (39, 40; 239, 240; 339, 340, 341) each of said U-shaped members having legs (39b, 40b; 239b, 240b; 339b, 340b) each of said legs having a plurality of slots (71), each of said U-shaped members further having a base;

wherein each of said bases has at least two of said diodes fastened thereto so as to create high thermal conductivity between said diodes and said U-shaped members;

wherein said first diodes are fastened to said first U-shaped member and said second diodes are fastened to said second U-shaped member;

wherein said first and second U-shaped members, respectively, form a conducting member connecting said anodes and said cathodes, respectively, to each other; and wherein said first diodes and said second diodes extend from said bases of said U-shaped sheet metal members in a direction parallel to the direction of said legs of said U-shaped sheet metal members in a direction parallel to the direction of said legs of said U-shaped sheet metal members;

further comprising a V-shaped body (146) having said bases of said U-shaped metal members fastened thereto, thereby maintaining said U-shaped sheet metal members in a predetermined position relative to each other.

2. In a rectifier assembly for furnishing DC current at a positive and negative terminal in response to AC energization, said rectifier assembly comprising a plurality of first diodes (14a, 14b, 14c) each having a cathode connected to said positive terminal and an anode, a plurality of second diodes (15a, 15b, 15c) each having an anode connected to said negative terminal and a cathode, and means connecting said diodes in pairs: a heat sink comprising at least a first and second U-shaped sheet metal member (39, 40; 239, 240; 339, 340, 341) each of said U-shaped members having legs (29b, 40b; 239b, 240b; 339b, 340b, 341b) each of said legs having a plurality of slots (71), each of said U-shaped members further having a base;

wherein each of said bases has at least two of said diodes fastened thereto so as to create high thermal conductivity between said diodes and said U-shaped members;

wherein said first diodes are fastened to said first U-shaped member and said second diodes are fastened to said U-shaped member;

wherein each of said first diodes has a massive metallic base constituting said cathode and each of said second diodes has a massive metallic base constituting said anode;

wherein said first and second U-shaped members, respectively, form a conducting member connecting said anodes and said cathodes, respectively, to each other;

wherein said legs of said first U-shaped member extend in a first predetermined direction from said base of said first U-shaped member and said legs of said second U-shaped member extend in a second predetermined direction from said base of said second U-shaped member;

wherein said first diodes are fastened to said base of said first U-shaped member so that said first diodes extend in a direction opposite said first predetermined direction, and said second diodes are fastened to said base of said second U-shaped member so that said second diodes project from said base in a direction opposite said second predetermined direction; and further comprising a plastic body (46,246) fastened to said bases of said U-shaped members and having recesses for receiving said diodes.

3. A rectifier assembly as set forth in claim 2, wherein said plastic body has a V-shaped form (54).

4. A rectifier arrangement as set forth in claim 3, wherein said V-shaped plastic body has a first and second lateral surface (47, 48) extending in a direction perpendicular to said bases of said U-shaped members;

wherein said anodes of said first diodes and said cathodes of said second diodes extend through said first lateral surface;

further comprising means for electrically connecting each of said anodes to a respective one of said cathodes.

5. A rectifier assembly as set forth in claim 4, wherein said means for connecting each of said anodes to a respective one of said cathodes comprises a plurality of metal strips (12a, 12b, 12c) abutting said first lateral surface of said plastic body.

6. A rectifier assembly as set forth in claim 5, wherein said metal strips have bores; and wherein said anodes of said first diodes and said cathodes of said second diodes pass through said bores and are soldered to said metal strips in the region of said bores.

7. A rectifier assembly as set forth in claim 4, further comprising three field exciter diodes, each having a cathode and an anode;

wherein said cathodes of said field exciter diodes are electrically connected to each other and each of said anodes of said field exciter diodes is connected to a respective one of said anodes of said first diodes;

and wherein said plastic body has further recesses for receiving said field exciter diodes.

8. A rectifier assembly as set forth in claim 7, wherein said metal strips have further bores;

and wherein said anodes of said field exciter diodes pass through said further bores and are soldered to said metal strips in the region of said further bores.

9. A rectifier assembly as set forth in claim 8, wherein said cathodes of said field exciter diodes pass through said second lateral surface of said V-shaped plastic body;

further comprising means connecting the so-protruding cathodes of said field exciter diodes to each other electrically.

10. A rectifier assembly as set forth in claim 9, wherein said means for electrically connecting said so-protruding cathodes of said field exciter diodes to each other comprises a metal strip (53) abutting said plastic body.

11. A rectifier assembly as set forth in claim 10, wherein each of said strips connecting said cathodes of said field exciter diodes to each other has a plurality of bores for allowing said passage of said cathodes therethrough;

and wherein said cathodes are soldered to said strips in the region of said bores.

12. A rectifier assembly as set forth in claim 11, wherein said plastic body comprises a first and second V-shaped member (46a, 46b) fitted one into the other and abutting each other at a boundary surface;

and wherein said anodes of said first diodes and said cathodes of said second diodes protrude through said first lateral surface of said plastic body at said boundary surface.

13. A rectifier assembly as set forth in claim 2, wherein said plastic body (246) is a bar-shaped body arranged between said U-shaped sheet metal members.

14. A rectifier assembly as set forth in claim 13, wherein said plastic member comprises a first and second bar-shaped member abutting at a boundary surface (270);

wherein said anode (244) of said first diode and said cathodes (245) of said second diodes terminate at said boundary surface;

and further comprising a plurality of electrical conductors (212a, 212b, 212c) extending along said boundary surface and connecting said anodes and cathodes in pairs.

15. A rectifier assembly as set forth in claim 14, further comprising three field exciter diodes, each having a cathode connected to the cathode of the others of said field exciter diodes and an anode connected to one of said electrical conductors;

wherein said field exciter diodes (16a, 16b, 16c) are arranged in said plastic body so that said anodes of said field exciter diodes terminate at said boundary surface of said first and second plastic members;

and wherein said anodes of said field exciter diodes are connected to said electrical conductors at said boundary surface.

16. A rectifier assembly as set forth in claim 15, wherein each of said field exciter diodes has an axis extending along said boundary surface of said two plastic members;

and wherein said field exciter diodes and said electrodes of said field exciter diodes have an axially symmetrical shape.

17. In a rectifier assembly for furnishing DC current at a positive and negative terminal in response to AC energization, said rectifier assembly comprising a plurality of first diodes (14a, 14b, 14c) each having a cathode connected to said positive terminal and an anode, a plurality of second diodes (15a, 15b, 15c) each having an anode connected to said negative terminal and a cathode, and means connecting said anodes of said first diodes and said cathodes of said second diodes in pairs: a heat sink comprising at least a first and second U-shaped sheet metal member (39, 40; 239, 240; 339, 340, 341) each of said U-shaped members having legs (39b, 40b; 239b, 240b; 339b, 340b, 341b) each of said legs having a plurality of slots (71), each of said U-shaped members further having a base;

wherein each of said bases has at least two of said diodes fastened thereto so as to create high thermal conductivity between said diodes and said U-shaped members;

wherein said first diodes are fastened to said first U-shaped member and said second diodes are fastened to said second U-shaped member;

wherein each of said first diodes has a massive metallic base constituting said cathode and each of said second diodes has a massive metallic base constituting said anode;

wherein said first and second U-shaped members, respectively, form a conducting member connecting said anodes and said cathodes, respectively, to each other;

wherein said first diodes and said second diodes extend from said bases of said U-shaped sheet metal members in a direction parallel to the direction of said legs of said U-shaped sheet metal members;

further comprising a V-shaped plastic body (146) having said bases of said U-shaped metal members fastened thereto, thereby maintaining said U-shaped sheet metal members in a predetermined position relative to each other.

18. A rectifier assembly as set forth in claim 17, further comprising a plurality of electrical conductors, each for connecting one of said anodes of said first diodes to a respective one of said cathodes of said second diodes, and a plurality of insulating guide members (607, 608, 609) for maintaining said electrical conductors in position between said legs of said U-shaped members.

19. A rectifier assembly as set forth in claim 18, further comprising three exciter field diodes each having a cathode connected to the cathode of the others of said exciter field diodes and each having an anode connected to one of said electrical conductors;

wherein said plastic body has a plane of symmetry (S—S);

and wherein said field exciter diodes (16a, 16b, 16c) are arranged in said plastic body in or near said plane of symmetry.

20. In a rectifier assembly for furnishing DC current at a positive and negative terminal in response to AC energization, said rectifier assembly comprising a plurality of first diodes (14a, 14b, 14c) each having a cathode connected to said positive terminal and an anode, a plurality of second diodes (15a, 15b, 15c) each having an anode connected to said negative terminal and a cathode, and means connecting said anodes of said first diodes and said cathodes of said second diodes in pairs: a heat sink comprising at least a first and second U-shaped sheet metal member (39, 40; 239, 240; 339, 340, 341) each of said U-shaped members having legs (39b, 40b; 239b, 240b; 339 b, 340 b, 341b) each of said legs having a plurality of slots (71), each of said U-shaped members further having a base;

wherein each of said bases has at least two of said didoes fastened thereto so as to create high thermal conductivity between such diodes and said U-shaped members;

further comprising a third U-shaped sheet metal member (341);

wherein each of said anodes of said first diodes and each of said cathodes of said second didoes comprises a massive metallic base (FIG. 16);

and wherein said first, second and third U-shaped metallic members constitute the electrical connection between the anode of said first diode and said cathode of said second diode mounted thereon.

21. A rectifier assembly as set forth in claim 20, wherein each of said U-shaped metallic members has legs extending in a predetermined direction relative to the base thereof;

wherein said diodes mounted on said metallic members extend in a direction opposite said predetermined direction;

further comprising a substantially U-shaped plastic body fastened to said bases of said U-shaped sheet metal members and having recesses for receiving said diodes.

22. A rectifier assembly as set forth in claim 21, further comprising a first and second electrical conductor (380, 381) for, respectively, connecting said cathodes of said first diodes and said anodes of said second diodes to each other;

wherein said plastic body has a top surface;

and wherein said first and second conductors are flushmounted along said top surface.

23. A rectifier assembly as set forth in claim 22, further comprising a first, second and third field exciter diode, each having a cathode connected to the other of said cathodes of said field exciter diodes and an anode connected to a respective one of said bases of said U-shaped metal members;

wherein said plastic body has additional recesses for receiving said field exciter diodes, each of said additional recesses being interposed between one of said first and one of said second diodes, said U-shaped plastic body having an inner edge;

further comprising a third electrical conductor (382) extending along said inner edge and interconnecting said cathodes of said field exciter diodes with each other.

24. In a rectifier assembly for furnishing DC current at a positive and negative terminal in response to AC energization, said rectifier assembly comprising a plurality of first diodes (14a, 14b, 14c) each having a cathode connected to said positive terminal and an anode, a plurality of second diodes (15a, 15b, 15c) each having an anode connected to said negative terminal and a cathode, and means connecting said diodes in pairs: a heat sink comprising at least a first and second U-shaped sheet metal member (39, 40; 239, 240; 339, 340, 341) each of said U-shaped members having legs (29b, 40b; 230b, 240b; 339b, 340b, 341b) each of said legs having a plurality of slots (71), each of said U-shaped members further having a base;

wherein each of said bases has at least two of said diodes fastened thereto so as to create high thermal conductivity between said diodes and said U-shaped members;

wherein said first diodes are fastened to said first U-shaped member and second diodes are fastened to said U-shaped member;

wherein said first and second U-shaped members, respectively, form a conducting member connecting said anodes and said cathodes, respectively, to each other;

wherein said legs of said first U-shaped member extend in a first predetermined direction from said base of said first Us-ahped member and said legs of said second U-shaped member extend in a second predetermined direction from said base of said second U-shaped member;

wherein said first diodes are fastened to said base of said first U-shaped member so that said first diodes extend in a direction opposite said first predetermined direction, and said second diodes are fastened to said base of said second U-shaped member so that said second diodes project from said base in a direction opposite said second predetermined direction; and further comprising a plastic body (46, 246) fastened to said bases of said U-shaped members and having recesses for receiving said diodes.

* * * * *